United States Patent [19]

Isakozawa et al.

[11] 4,283,627

[45] Aug. 11, 1981

[54] ELECTRON MICROSCOPE

[75] Inventors: Shigeto Isakozawa, Katsuta; Kazuo Shii, Asahimura, both of Japan

[73] Assignee: Hitachi, Ltd., Tokyo, Japan

[21] Appl. No.: 98,664

[22] Filed: Nov. 29, 1979

[30] Foreign Application Priority Data

Dec. 1, 1978 [JP] Japan ................................. 53-147927

[51] Int. Cl.³ .......................................... G01N 23/00
[52] U.S. Cl. .................................... 250/311; 250/398
[58] Field of Search ................... 250/306, 311, 396 R, 250/397, 398; 313/359, 361, 421

[56] References Cited

U.S. PATENT DOCUMENTS

| | | | |
|---|---|---|---|
| 3,737,659 | 6/1973 | Yanaka et al. | 250/311 |
| 4,044,254 | 8/1977 | Krisch et al. | 250/311 |

*Primary Examiner*—Bruce C. Anderson
*Attorney, Agent, or Firm*—Craig and Antonelli

[57] ABSTRACT

The electron beam having penetrated a sample is projected on a field limiting plate having an opening by means of an objective lens. That part of the electron beam which has passed through the opening of the field limiting plate, is projected upon a viewing screen by means of an image forming lens system. An electron beam deflection system is disposed between the hind focal point of the objective lens and the field limiting plate, the system having its deflection center at the hind focal point of the objective lens.

10 Claims, 1 Drawing Figure

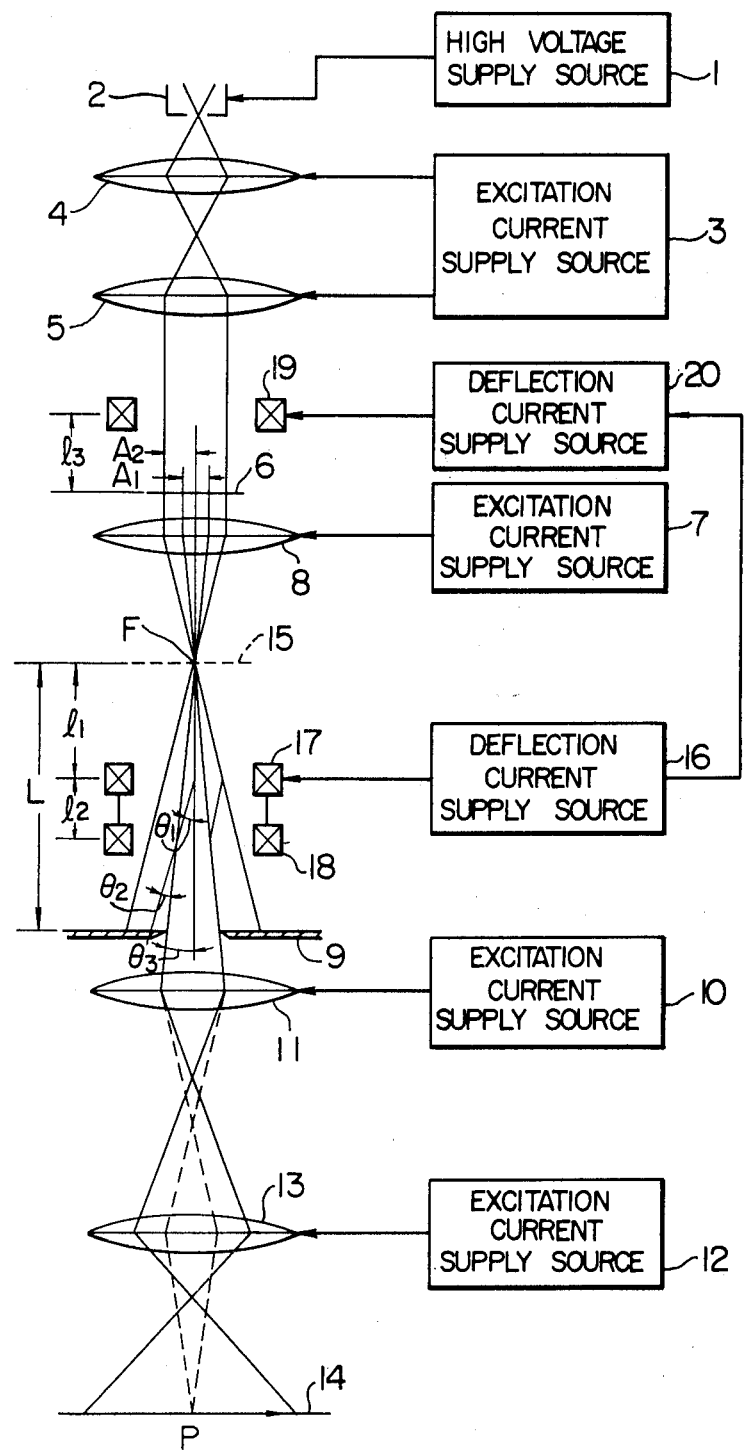

ELECTRON MICROSCOPE

This invention relates to an electron microscope adapted for selectively shifting the observation field over a sample electrically.

In the examination of a sample by an electron microscope, the observation field is often selectively shifted from one spot to another over the sample. The selective shifting of the observation field is usually performed by shifting the sample on a plane perpendicular to the axis of electron beam by some mechanical device. According to an example of such a scheme wherein the produced image is at a magnification of 500,000 and the viewing screen for observing the produced image has a diameter of 100 mm, if a sample is shifted by a distance of 1 $\mu$m, the point on the produced image located at the center of the viewing screen is moved to the periphery of the screen, that is, the shift of the produced image on the screen is by 50 mm. In practice, however, it is difficult to shift the sample by a microscopic distance with high accuracy since the mechanical shifting device such as, for example, a micrometer cannot be free from structural inaccuracy on a microscopic scale.

To overcome the above difficulty, it is necessary to perform the selective shift of the observation field by deflecting the electron beam electrically. With this in mind, the Inventor disposed an electromagnetic beam deflector between the second or hind focal plane of the objective lens and the intermediate lens posterior to the hind focal plane and attempted to selectively shift the observation field over the sample by changing the deflection current flowing through the electromagnetic beam deflector. According to this attempt, however, although an ordinary image on the viewing screen derived from the transmitted electrons can be shifted with a high precision, that is, the observation field can be selectively shifted over the sample with a high precision, the center of the diffracted image formed by the transmitted electrons, corresponding to the ordinary image formed by the transmitted electrons is also shifted so that the analysis of the diffracted image is made very difficult or that the efficiency of the analysis is considerably lowered.

One object of this invention is therefore to provide an electron microscope adapted for electrically shifting the observation field of the microscope over a sample.

Another object of this invention is to provide an electron microscope adapted for obtaining a diffracted image formed by the transmitted electrons, the center of the diffracted image being not shifted even when the corresponding ordinary image formed by the transmitted electrons is shifted electrically over a sample for selective observation.

According to this invention, which has been made to attain the above objects, there is provided an electron microscope comprising a means for producing an electron beam; a means for directing the electron beam to a sample whereby the beam may penetrate the sample; an objective lens disposed in the path of the beam; a means for deflecting the transmitted beam with the hind focus of the objective lens set substantially as the deflecting center; and a viewing screen on which the deflected beam is cast.

Other objects, features and advantages of this invention will be apparent when one reads the following description with the aid of the attached drawings, in which:

The FIGURE schematically shows the electrooptical system of an electron microscope as an embodiment of this invention, including the associated electronic circuit in block diagram.

In the FIGURE, a high voltage supply source 1 is connected with an electron gun 2, which emits an electron beam. The electron beam is converted, by means of a condenser lens system consisting mainly of condenser lenses 4 and 5 energized by an excitation current supply source 3, to a parallel or substantially parallel beam directed toward a sample 6. The sample 6 is therefore irradiated by the parallel beam. The cast electron beam then penetrates the sample 6 and the transmitted beam is cast onto a field limiting plate 9 having an opening by means of an objective lens 8 excited by an excitation current supply source 7 and disposed as an image forming lens in the path of the transmitted beam. Accordingly, an image of the sample 6 formed by the transmitted electrons is focused on the field limiting plate 9. That portion of the transmitted beam which has passed through the opening of the field limiting plate 9 is cast onto a viewing screen 14 by means of an intermediate lens 11 excited as an image forming lens by an excitation current supply source 10 and by means of a projecting lens 13 energized as an image forming lens by an excitation current supply source 12. As a result, an ordinary magnified image by the transmitted electrons, belonging to the observation field $A_1$ of the sample 6 corresponding to the opening of the field limiting plate 9, is formed on the viewing screen 14. The irradiated surface of the viewing screen 14 is applied with a fluorescent layer and the magnified electron image formed on the fluorescent layer is turned visible.

In the observation of an ordinary image formed by transmitted electrons, the diffracted image of the sample 6 formed by the transmitted electrons is formed on the hind focal plane 15 of the objective lens 8 and the center of the diffracted image coincides in position with the hind focal point F of the lens 8. An object surface of the intermediate lens 11 coincides in position with the plane on which the ordinary image by the transmitted electrons is formed, that is, on which the field limiting plate 9 having the opening is placed. Under the above conditions, if the object surface of the intermediate lens 11 is adjusted coincident with the hind focal plane 15 of the objective lens 8 by changing the excitation current supplied from the excitation current supply source 10 to the intermediate lens 11, that is, by changing the focal distance of the intermediate lens 11, then the diffracted image of the sample 6 by the transmitted electrons belonging to the observation field $A_1$ is displayed on a magnified scale on the viewing screen 14 by dint of an image forming lens system consisting mainly of the objective lens 8, the intermediate lens 11 and the projecting lens 13. The point P indicated on the viewing screen 14 coincides with the center of the diffracted image.

Between the hind focal point F of the objective lens 8 and the field limiting plate 9 is disposed an electron beam deflection system with which a deflection current supply source 16 is connected. The electron beam deflection system, provided to deflect the electron beam passing therethrough in two dimensional space with the deflection center located at the hind focal point F of the objective lens 8, comprises a first deflector 17 and a second deflector 18, both electromagnetic type, which are connected in series with each other so as to deflect the electron beam in the two directions opposite to each other. Namely, let $\theta_1$ designate the deflection angle of the electron beam by the first deflector 17, $\theta_2$ the deflection angle of the beam by the second deflector 18, $l_1$ the distance between the hind focal point F and the first deflector 17, and $l_2$ the distance between the first and second deflectors 17 and 18. Then, the deflection angles $\theta_1$ and $\theta_2$ are so selected that the following equation (1) may hold.

$$(\theta_1/\theta_2) = (l_1 + l_2)/l_1 \tag{1}$$

Accordingly, the deflection center of the electron beam in the electron beam deflection system coincides with the hind focal point F of the objective lens 8 and the deflection angle $\theta_3$ as a whole of the beam deflected by the electron beam deflection system is given by the following equation (2).

$$\theta_3 = \theta_1 - \theta_2$$

In general, the deflection angle of electron beam by an electron beam deflector of electromagnetic type is proportional to the deflection current flowing through the deflector and the number of the turns of the coil forming the deflector. Let the numbers of the turns of the coils respectively forming the first and second deflector 17 and 18 be denoted by $n_1$ and $n_2$. Then, the equation (1) can be satisfied for any amount of deflection current if the numbers $n_1$ and $n_2$ are related to each other as follows in (3).

$$(n_1/n_2) = (l_1 + l_2)/l_1 = (\theta_1/\theta_2) \tag{3}$$

When the electron beam is deflected by an angle $\theta_3$ by the electron beam deflection system with the deflection center located at the hind focal point F of the objective lens 8, the observation field $A_2$ of the sample 6 is selected. Accordingly, if the object surface of the intermediate lens 11 is so adjusted as to coincide with the plane where the field limiting plate 9 is placed, by changing the exciting current supplied from the source 10 to the lens 11, that is, by changing the focal distance of the lens 11, then the ordinary image of the sample 6 formed by the transmitted electrons belonging to the observation field $A_2$ corresponding to the opening of the field limitng plate 9 is formed on a magnified scale on the viewing screen 14 by the combined effect of the intermediate lens 11 and the projecting lens 12. The thus formed image is located in the position where an ordinary image formed by the transmitted electrons is focused on the viewing screen 14 when such an electron beam deflection system as described above is not used. This means that the ordinary image formed on the viewing screen 14 by the transmitted electrons fluctuates depending on the selection of the observation fields of the sample 6. Since the amount of the shift of the ordinary image formed by the transmitted electrons on the field limiting plate 9 is $L\theta_3$, where L is the distance between the hind focal point F of the objective lens 8 and the field limiting plate 9, then the amount $\Delta x$ of the shift of the ordinary image on the viewing screen 14 is given by the equation (4) as follows.

$$\Delta x = L\theta_3 M_i M_p = (Ll_2\theta_1 M_i M_p)/(l_1 + l_2) \tag{4}$$

, where $M_i$ is the magnification of the intermediate lens 11 and $M_p$ is the magnification of the projecting lens 13.

While the ordinary image of the sample formed by the transmitted electrons belonging to the observation field $A_2$ is under observation, the diffracted image of the sample 6 made by the transmitted electrons is formed on the hind focal plane 15 of the objective lens 8 with its center coincident with the focal point F. Accordingly, if the object surface of the intermediate lens 8 is made coincident with the hind focal plane 15 of the lens 8 by changing the exciting current supplied from the source 10 to the lens 11, that is, by changing the focal distance of the lens 11, then only the electrons passing through the observation field $A_2$ of the sample pass through the opening of the field limiting plate 9. As a result, the diffracted image of the sample 6 belonging to the observation field $A_2$ is formed on a magnified scale on the viewing screen 14 by the combined effect of the objective lens 8, the intermediate lens 11 and the projecting lens 13, with the center of the diffracted image coincident with the point P. Namely, in this case, the center of the diffracted image is not shifted even when the observation field of the sample 6 is changed from one phase to another.

The observation fields of the sample 6 can be selected, that is, the ordinary image of the sample 6 can be shifted selectively on the viewing screen 14 by the use of only one of the first and second deflectors 17 and 18. The same is true for the case where the first and second deflectors 17 and 18 is so used as to satisfy the relation $\theta_3 \neq \theta_1 - \theta_2$. In both the above cases, however, the deflecting center of the electron beam is shifted to a point other than the focal point F on the hind focal plane 15 of the objective lens 8 and the center of the diffracted image of the sample 6 is shifted to that point. Accordingly, if the object surface of the intermediate lens 11 is adjusted coincident with the hind focal plane 15 of the objective lens 8 by controlling the focal distance of the intermediate lens 11, the center of the diffracted image is shifted to a point different from the point P on the viewing screen 14.

According to the electron microscope shown as an embodiment of this invention in FIG. 1, on the other hand, the deflection angle $\theta_3$ of the beam reflected by the electron beam deflection system satisfies the equation $\theta_3 = \theta_1 - \theta_2$ so that the deflection center of the electron beam coincides in position with the hind focal point F of the objective lens 8. As described before, even if the ordinary image of the sample 6 is selectively shifted on the viewing screen 14 for the examination of a desired observation field, the center of the diffracted image of the sample 6 formed on the viewing screen 14 is always stationary and coincides with the point P so that the diffracted image of the sample can be analized easily.

In the embodiment shown in the FIGURE, the electron beam deflection system includes two beam deflectors, but the system may include only one beam deflector if the beam deflector is located in the hind focal plane 15 of the objective lens 8. For, in this single deflector configuration, the deflection center of the electron beam deflected by the electron beam deflection system can be made coincident with the hind focal point F of the objective lens 8. However, in the case where the focal distance of the objective lens 8 is so shortened as to cause the hind focal point F to assume the position in the lens 8 by strongly exciting the objective lens 8, it is difficult in practice to locate the electron beam deflection system in the hind focal plane of the objective lens 8 since the geometry of the objective lens 8 hinders the positioning of the system. In this case, therefore, it is preferable to dispose the electron beam deflection system including the first and second deflectors 17 and 18 in the stage posterior to the hind focal point F of the objective lens 8, as shown in the FIGURE.

As apparent from the above expression (4), since Δx is proportional to $\theta_3$, the ordinary image on the viewing screen 14 can be shifted by any desired distance, that is, any desired observation field of the sample 6 can be selected, by controlling the deflection current supplied from the source 16 to the electron beam deflection system in such a manner that the deflection angle $\theta_3$ is suitably changed. It is however apparent that if $\theta_3$ is too large, no image appears on the viewing screen 14. This phenomenon of image missing tends to take place when the magnification is very large. This is because the diameter of the electron beam cast on the sample is reduced to several microns at very high magnifications. This problem can however be solved by deflecting the electron beam probing into the sample in response to the variation of $\theta_3$. Namely, the deflection angle $\phi$ to be newly introduced is given by the equation (5) below.

$$\phi = L\theta_3/l_3 M_o \tag{5}$$

, where $l_3$ is the distance from the deflection center of the beam irradiating the sample 6 to the sample 6 and $M_o$ is the magnification of the objective lens 8.

As shown in the FIGURE, the electron beam to irradiate the sample 6 is deflected by supplying the deflection current for two-dimensional deflection from the deflection current supply source 20 to the beam deflector 19 of electromagnetic type disposed anterior to and separated by a distance $l_3$ from the sample 6. Moreover, the proportional control of $\phi$ in which $\phi$ is so controlled as to satisfy the equation (5), is performed by relating the source 20 to the source 16 so that the deflection current supplied from the source 20 to the deflector 19 may be varied in proportion to the deflection current supplied from the source 16 to the electron beam deflection system.

Although the deflectors 17, 18 and 19 shown in the FIGURE are of an electromagnetic type consisting of coils, they may be replaced by deflectors of electrostatic type having deflection electrodes. Moreover, the field limiting plate 9 may be discarded. Further, the image forming lens system may include one or two image forming lenses or more than three such lenses.

Concerning the preferred embodiment of this invention, described above and shown in the attached drawings, numerous variations and modifications within the scope and spirit of this invention can be easily thought of by those skilled in the art and it should be emphasized that this invention is by no means limited by the above embodiment.

What we claim is:

1. An electron microscope comprising means for producing an electron beam; means for directing said electron beam to a sample whereby said beam penetrates said sample; an objective lens disposed in the path of said beam; first means for deflecting the transmitted beam with the hind focal point of said objective lens set substantially as the deflecting center so as to select the observation field of said sample; a viewing screen on which the deflected beam is cast; and second means for deflecting said electron beam directed at said sample in response to the deflection of said transmitted beam by said first means.

2. An electron microscope as claimed in claim 1, wherein said means for deflecting said transmitted beam includes a first and a second beam deflectors disposed between said hind focal point of said objective lens and said viewing screen to deflect said transmitted beam in the directions opposite to each other.

3. An electron microscope as claimed in claim 2, wherein the deflection angles $\theta_1$ and $\theta_2$ of said transmitted beam deflected by said first and second deflectors substantially satisfy the equation $\theta_1/\theta_2 = (l_1+l_2)/l_1$, where $l_1$ is the distance between said hind focal point and said first beam deflector and $l_2$ is the distance between said first and second beam deflectors.

4. An electron microscope as claimed in claim 3, wherein each of said first and second beam deflectors is an electromagnetic type beam deflector consisting mainly of a coil.

5. An electron microscope as claimed in claim 4, wherein the numbers $n_1$ and $n_2$ of turns of said coils serving respectively as said first and second beam deflectors substantially satisfy the equation $n_1/n_2 = \theta_1/\theta_2$.

6. An electron microscope as claimed in claim 1, wherein said second means for deflecting said electron beam directed at said sample includes means for controlling the deflection angle of said beam directed at said sample in proportion to the deflection angle of said transmitted beam.

7. An electron microscope as claimed in claim 6, wherein said means for deflecting said electron beam directed at said second sample includes a beam deflector of electromagnetic type.

8. An electron microscope comprising means for producing an electron beam; means for directing said electron beam to a sample whereby said beam penetrates said sample; an objective lens disposed in the path of the transmitted beam to form an ordinary image of the transmitted electrons in a first predetermined position; first means disposed between the hind focal point of said objective lens and said first predetermined position to deflect said transmitted beam, with the deflecting center of said transmitted beam located substantially at said hind focal point of said objective lens so as to select the observation field of said sample; a field limiting plate disposed at said first predetermined position and having an opening through which a part of said transmitted beam passes; an image forming lens for projecting the ordinary image of the transmitted electrons formed in said opening upon a second predetermined position on a magnified scale; means for varying the focal distance of said image forming lens; a viewing screen disposed in said second predetermined position; and second means for deflecting the electron beam directed at said sample in proportion to the deflection of said transmitted beam.

9. An electron microscope as claimed in claim 8, wherein said means for deflecting said transmitted beam includes a first and a second beam deflectors of electromagnetic type for deflecting said transmitted beam in the directions opposite to each other.

10. An electron microscope as claimed in claim 9, wherein said means for deflecting said beam directed at said sample includes a beam deflector of electromagnetic type.

* * * * *